(12) United States Patent
Fukuda et al.

(10) Patent No.: US 6,593,601 B2
(45) Date of Patent: Jul. 15, 2003

(54) INTEGRATED CIRCUIT DEVICE THAT CAN SUPPRESS UNDESIRED INTER-DEVICE EFFECTS

(75) Inventors: Takeshi Fukuda, Takatsuki (JP); Junji Itoh, Hirakata (JP)

(73) Assignee: Matsushita Electric Industrial Co., Ltd., Osaka-fu (JP)

(*) Notice: Subject to any disclaimer, the term of this patent is extended or adjusted under 35 U.S.C. 154(b) by 0 days.

(21) Appl. No.: 10/136,930

(22) Filed: Apr. 30, 2002

(65) Prior Publication Data

US 2002/0167027 A1 Nov. 14, 2002

(30) Foreign Application Priority Data

May 9, 2001 (JP) ........................................ 2001-138155

(51) Int. Cl.[7] .............................................. H01L 29/74
(52) U.S. Cl. ..................... 257/173; 257/355; 257/500; 257/547
(58) Field of Search ..................... 257/173, 355–363, 257/349, 547, 620, 500, 544

(56) References Cited

U.S. PATENT DOCUMENTS

| | | | | | |
|---|---|---|---|---|---|
| 4,628,343 | A | * | 12/1986 | Komatsu | 257/659 |
| 5,545,917 | A | * | 8/1996 | Peppiette et al. | 257/547 |
| 5,670,799 | A | * | 9/1997 | Croft | 257/173 |
| 6,355,537 | B1 | * | 3/2002 | Seefeldt | 438/405 |

* cited by examiner

Primary Examiner—David Nelms
Assistant Examiner—Andy Huynh

(57) ABSTRACT

When forming first and second circuits on a semiconductor substrate, an isolation region is provided between the first and second circuits by embedding a conductor in the semiconductor substrate. Also, an output node of a low impedance voltage output circuit that provides a fixed voltage at low impedance is connected to the isolation region. In this way, a noise current caused by high-frequency noise generated from the first or second circuit flows into the low impedance voltage output circuit. Hence leakage of noise signals between the circuits can be suppressed.

13 Claims, 6 Drawing Sheets

INTEGRATED CIRCUIT DEVICE THAT CAN SUPPRESS UNDESIRED INTER-DEVICE EFFECTS

This application is based on an application No. 2001-138155 filed in Japan, the contents of which are hereby incorporated by reference.

BACKGROUND OF THE INVENTION

1. Field of the Invention

The present invention relates to an integrated circuit device, and especially relates to inter-device isolation.

2. Related Art

FIGS. 1A and 1B are schematic representations of an integrated circuit device which is a related art of the present invention. FIG. 1A is a plan view, whereas FIG. 1B is a sectional view. This integrated circuit device is roughly made up of a semiconductor substrate 901, a first circuit 907, a second circuit 908, and connector terminals 906. The semiconductor substrate 901 is formed from Si. The first circuit 907 includes semiconductor devices formed in the semiconductor substrate 901 and an insulator film and wires formed on the semiconductor substrate 901 (not illustrated). The second circuit 908 is provided at a different location from the first circuit 907. The connector terminals 906 perform signal input/output with outside the integrated circuit device.

Also, an isolation region 902 is provided around the first circuit 907, to prevent a signal from leaking between the first circuit 907 and the second circuit 908 through the semiconductor substrate 901 which has conductivity.

This isolation region 902 is formed by etching a trench in the semiconductor substrate 901 and filling the trench with an insulator such as silicon dioxide. In this way, a part of the semiconductor substrate 901 which belongs to the first circuit 907 and a part of the semiconductor substrate 901 which belongs to the second circuit 908 are isolated from each other.

However, the isolation region 902, provided between the part of the semiconductor substrate 901 which belongs to the first circuit 907 and the part of the semiconductor substrate 901 which belongs to the second circuit 908, forms the electrical equivalent of a capacitor. Hence the isolation region 902 cannot sufficiently suppress signal interference in a high-frequency range.

FIG. 2 shows an equivalent circuit of the integrated circuit device shown in FIGS. 1A and 1B. The principle of signal interference is explained below, by referring to FIG. 2.

Each of the wires and semiconductor devices (not illustrated) included in the first and second circuits 907 and 908 is coupled to the semiconductor substrate 901, through the capacitance of the insulator film (not illustrated) typically formed between the wire and the semiconductor substrate 901 and the junction capacitance between the semiconductor device and the semiconductor substrate 901. These can be represented by capacitances 920, a part 921a of the semiconductor substrate 901 which belongs to the first circuit 907, and a part 921b of the semiconductor substrate 901 which belongs to the second circuit 908.

The part 921a and the part 921b are opposed to each other with the isolation region 902 interposed in between. This isolation region 902 is made up of the insulator embedded in the trench. Accordingly, it can be said that the part 921a and the part 921b are connected to each other via an isolation capacitance 922. A signal having a high-frequency component passes through the isolation capacitance 922, so that interference occurs between the first circuit 907 and the second circuit 908 due to the signal leakage. This reduces the performance of the integrated circuit device. For example, if a noise signal having a high-frequency component is caused by a high-amplitude signal generated from a logic circuit or a local oscillator and leaks to another circuit that handles weaker signals, such as a radio signal receiving circuit, the performance of the receiving circuit may be markedly reduced. In particular, in the case of a direct conversion architecture which has been under study in recent years, a high-frequency oscillator needs to be used. This makes it impossible to ignore the effects of noise generated from such an oscillator. Thus, there are difficulties in integrating all necessary functions of a radio transmission/reception device, including receivers, logic circuits, and local oscillators, into a single integrated circuit device.

SUMMARY OF THE INVENTION

The present invention has an object of providing an integrated circuit device that can suppress undesired effects caused by leakage of noise signals between a plurality of circuits.

The stated object can be achieved by an integrated circuit device including: a first circuit which is formed on a semiconductor substrate; a second circuit which is formed on the semiconductor substrate at a location different from the first circuit; an isolation region which has a higher conductivity than the semiconductor substrate, and is formed in the semiconductor substrate between the first circuit and the second circuit; and a low impedance voltage output circuit which provides a fixed voltage at a low impedance, to the isolation region.

With this construction, even when a noise signal having a high-frequency component occurs, a current caused by the noise signal flows through the isolation region into the low impedance voltage output circuit, so that signal leakage between the first and second circuits is suppressed. This enables different circuits, such as logic circuits and transmission/reception circuits, which handle largely different levels of signals, to be integrated into a single integrated circuit device.

BRIEF DESCRIPTION OF THE DRAWINGS

These and other objects, advantages and features of the invention will become apparent from the following description thereof taken in conjunction with the accompanying drawings which illustrate specific embodiments of the invention.

In the drawings.

DESCRIPTION OF THE PREFERRED EMBODIMENT

The following is a description of an embodiment of the present invention, with reference to drawings.

Figure 1B:
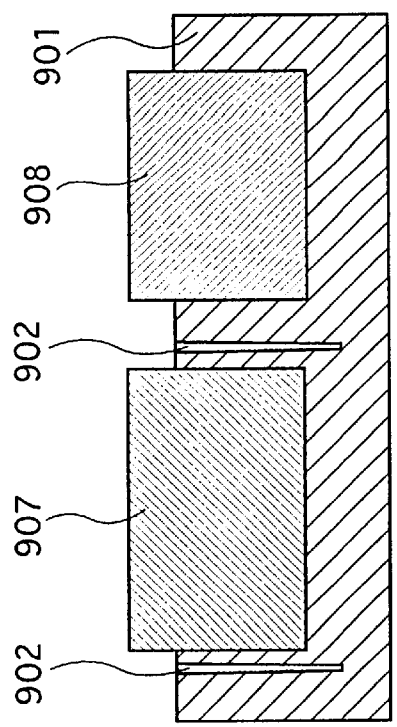
FIGS. 1A and 1B are schematic representations of an integrated circuit device which is a related art of the present invention.
Figure 1A:
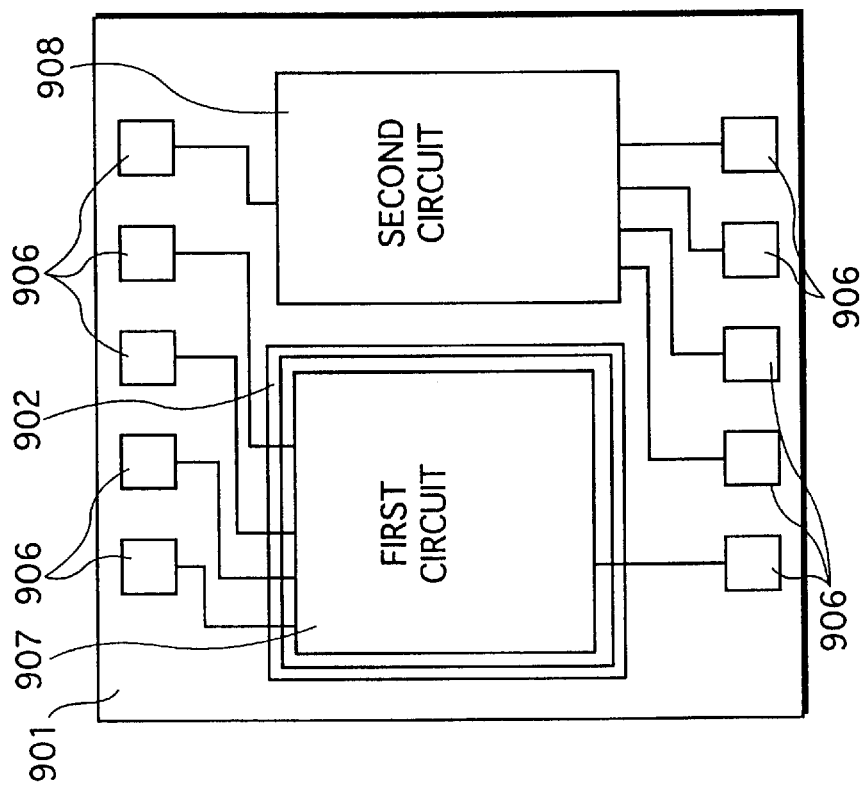
Figure 2:
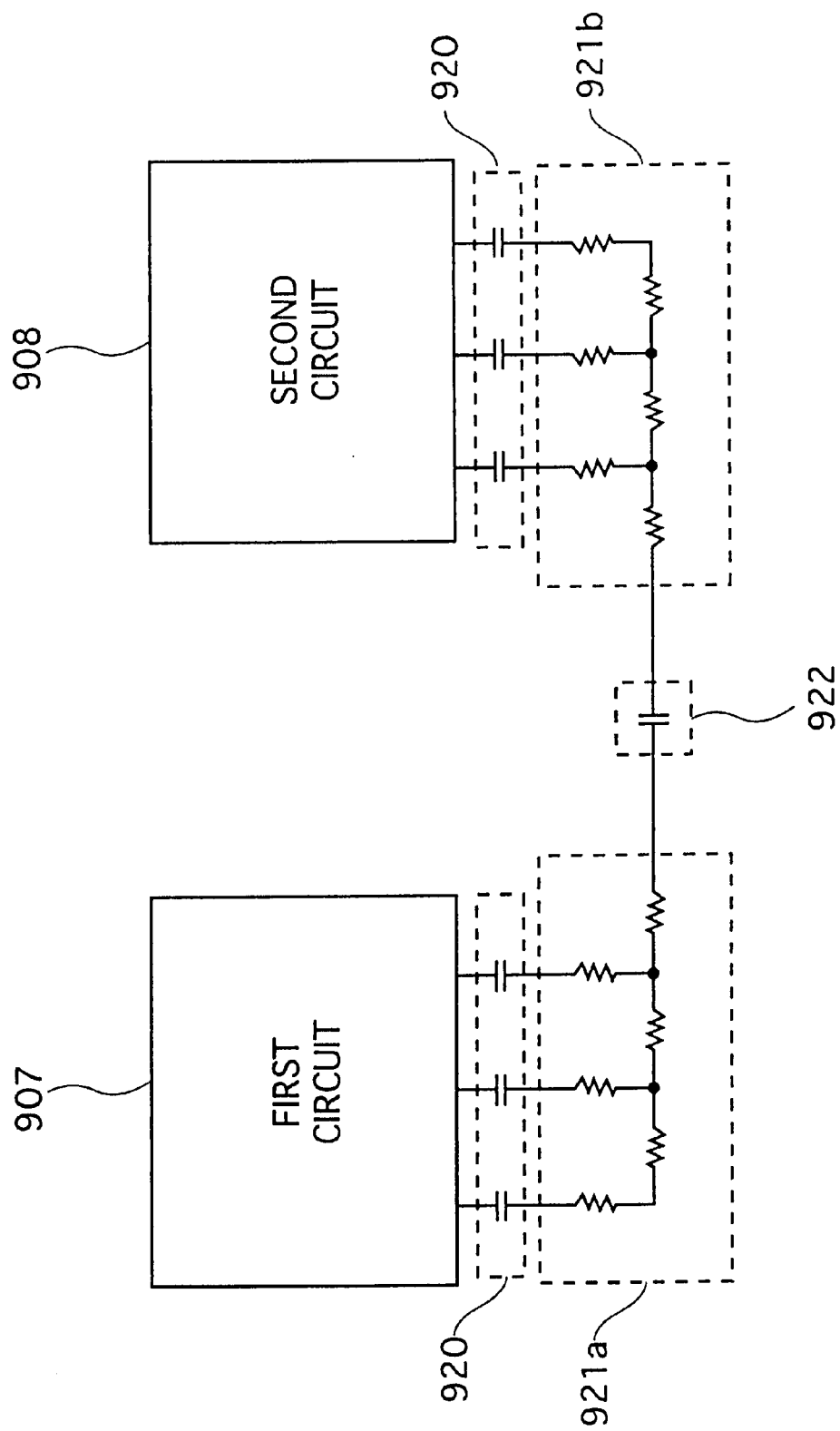
FIG. 2 shows an equivalent circuit of the integrated circuit device shown in FIGS. 1A and 1B.
Figure 3B:
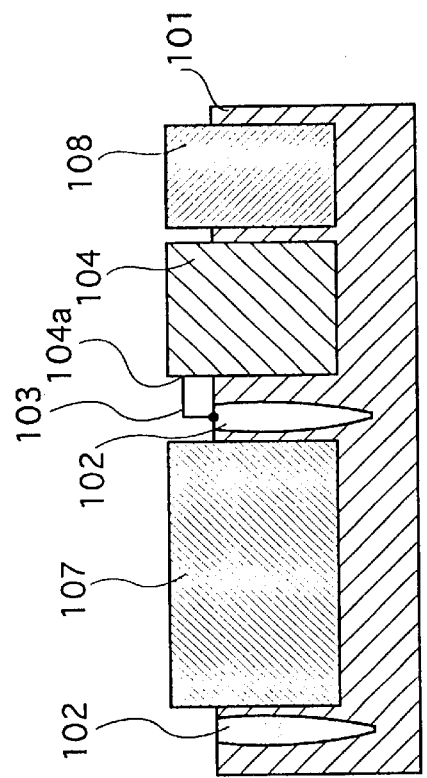
FIGS. 3A and 3B are schematic representations of an integrated circuit device which is an embodiment of the present invention.
Figure 3A:
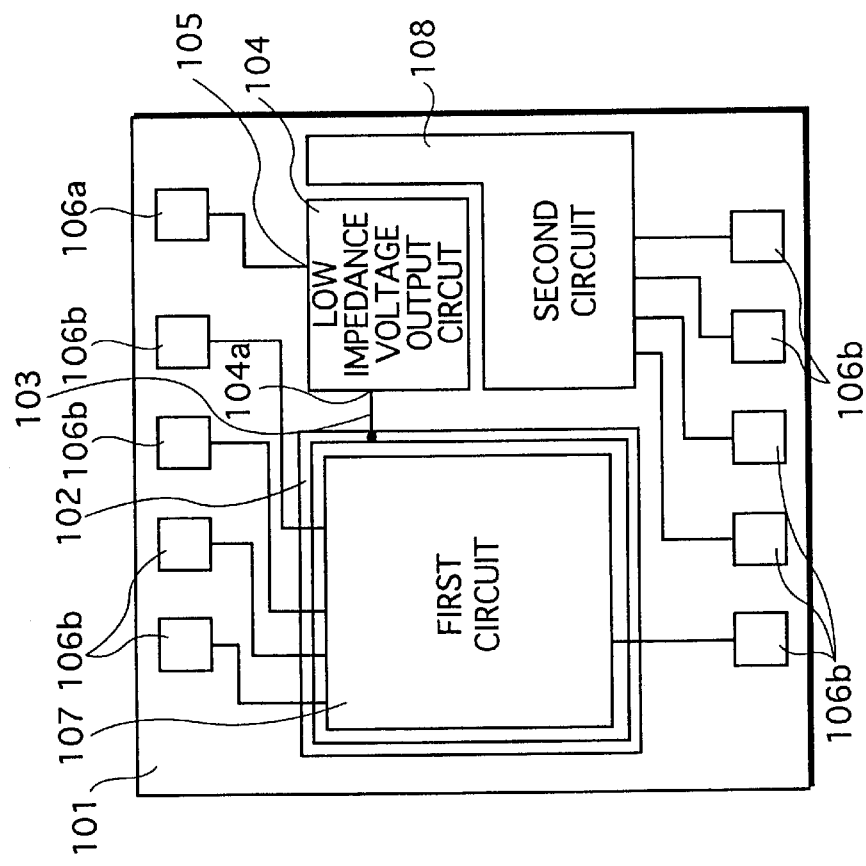

FIGS. 3A and 3B are schematic representations of an integrated circuit device which is the embodiment of the present invention. FIG. 3A is a plan view, whereas FIG. 3B is a sectional view.

The integrated circuit device of this embodiment is roughly made up of a semiconductor substrate 101, a first circuit 107, a second circuit 108, and connector terminals 106b. The first circuit 107 includes semiconductor devices formed in the semiconductor substrate 101 and an insulator film and wires formed on the semiconductor substrate 101 (not illustrated). The second circuit 108 is formed at a different location from the first circuit 107. The connector terminals 106b perform signal input/output with outside the integrated circuit device. As one example, the first circuit 107 includes a local oscillator, and the second circuit 108 is a radio reception circuit.

Also, to prevent a signal from leaking between the first circuit 107 and the second circuit 108 through the semiconductor substrate 101 which has conductivity, an isolation region 102 is provided between the first circuit 107 and the second circuit 108.

This isolation region 102 is formed from a conductor that is embedded in the semiconductor substrate 101. The isolation region 102 is connected to an output node 104a of a low impedance voltage output circuit 104 via a wire 103.

The low impedance voltage output circuit 104 has a function of providing a fixed voltage that corresponds to a predetermined reference potential, at low impedance from direct current through to high-frequency current. Accordingly, the potential of the isolation region 102 which is connected to the low impedance voltage output circuit 104 is kept at low impedance from direct current through to high-frequency current. Hence a noise signal having a high-frequency component, which is generated on one side of the isolation region 102, is kept from leaking to the other side of the isolation region 102.

Figure 4:
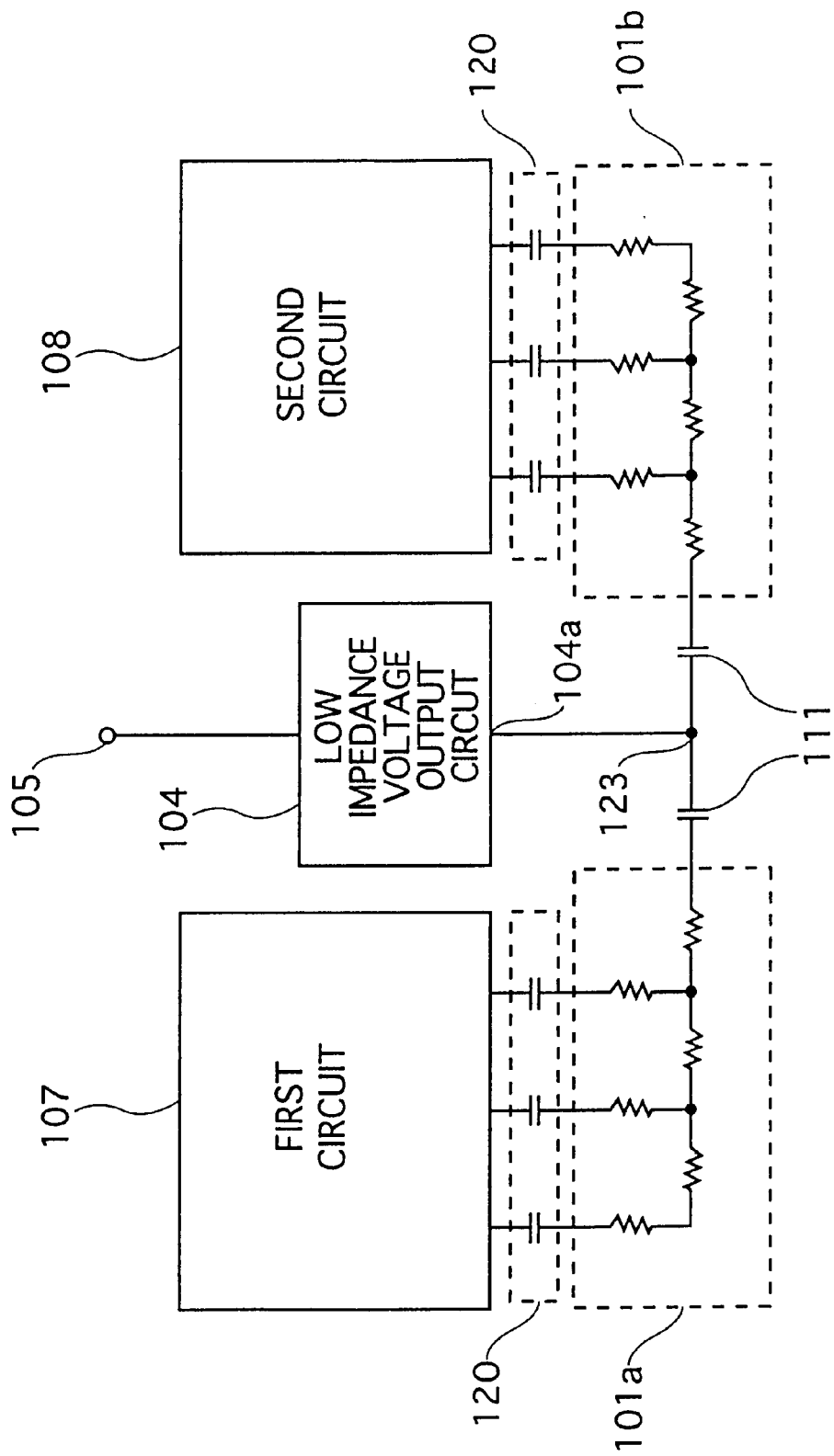
FIG. 4 shows an equivalent circuit of the integrated circuit device shown in FIGS. 3A and 3B, to explain how leakage of a noise signal is suppressed.

FIG. 4 shows an equivalent circuit of the integrated circuit device shown in FIGS. 3A and 3B, to explain how leakage of a noise signal is suppressed.

Each of the wires and semiconductor devices (not illustrated) included in the first and second circuits 107 and 108 is coupled to the semiconductor substrate 101 through the capacitance of the insulator film (not illustrated) formed between the wire and the semiconductor substrate 101 (see FIGS. 3A and 3B) and the junction capacitance between the semiconductor device and the semiconductor substrate 101. Which is to say, a coupling capacitance 120 exists between the semiconductor substrate 101 and each of the first and second circuits 107 and 108.

Also, two parts 101a and 101b of the semiconductor substrate 101 can each be regarded as a collection of resistors connected in series or in parallel.

The part 101a of the semiconductor substrate 101 which belongs to the first circuit 107 and the part 101b of the semiconductor substrate 101 which belongs to the second circuit 108 are opposed to each other with the isolation region 102 interposed in between (see FIGS. 3A and 3B). This isolation region 102 is made up of the conductor embedded in the semiconductor substrate 101. In the equivalent circuit shown in FIG. 4, these are represented by a capacitance 111 between the semiconductor substrate 101 and the isolation region 102, which corresponds to the capacitance of an insulator between the conductor and each of the parts 101a and 101b or the junction capacitance between the conductor and each of the parts 101a and 101b.

Here, the conductor that forms the isolation region 102 is shown by a junction 123 of the capacitances 111. This junction 123 is connected to the output node 104a of the low impedance voltage output circuit 104. As a result, the junction 123 is held at a fixed potential that is determined by the reference potential of the low impedance voltage output circuit 104, from direct current through to high-frequency current.

A noise current from the first circuit 107 flows through the junction 123 into the low impedance voltage output circuit 104, with it being possible to keep the noise current from leaking to the second circuit 108. Likewise, leakage of noise from the second circuit 108 to the first circuit 107 is suppressed.

Thus, with the provision of the isolation region 102 and the low impedance voltage output circuit 104, a noise signal generated from a circuit, such as a logic circuit or a local oscillator, that handles large signals, is kept from leaking to a receiver that handles weak signals. This enables most or all of the necessary functions of a transmission/reception circuit to be integrated into a single integrated circuit device.

Here, by providing a number of low impedance voltage output circuits 104 around the isolation region 102, the effects of the impedance in the isolation region 102 can be reduced, and the total impedance of the isolation region 102 can be decreased. Furthermore, by providing the low impedance voltage output circuit 104 near the isolation region 102, the wire 103 can be shortened, with it being possible to reduce the impedance of the wire 103. Hence leakage of noise can be suppressed more efficiently.

Here, it is preferable to form the isolation region 102 using a material which has a higher conductivity than the semiconductor substrate 101 around the isolation region 102, in order to decrease the impedance of the isolation region 102 itself. For example, the isolation region 102 may be formed as an $N^+$ or $P^+$ region made by ion implantation. As an alternative, the isolation region 102 may be formed using a conductor which is embedded in the semiconductor substrate 101 via an insulator such as silicon dioxide (not illustrated). The conductor referred to here may be $N^+$ polysilicon or $P^+$ polysilicon which is doped with a high concentration of impurities, or a metal.

The following explains a specific example of a construction of the low impedance voltage output circuit 104.

Figure 5:
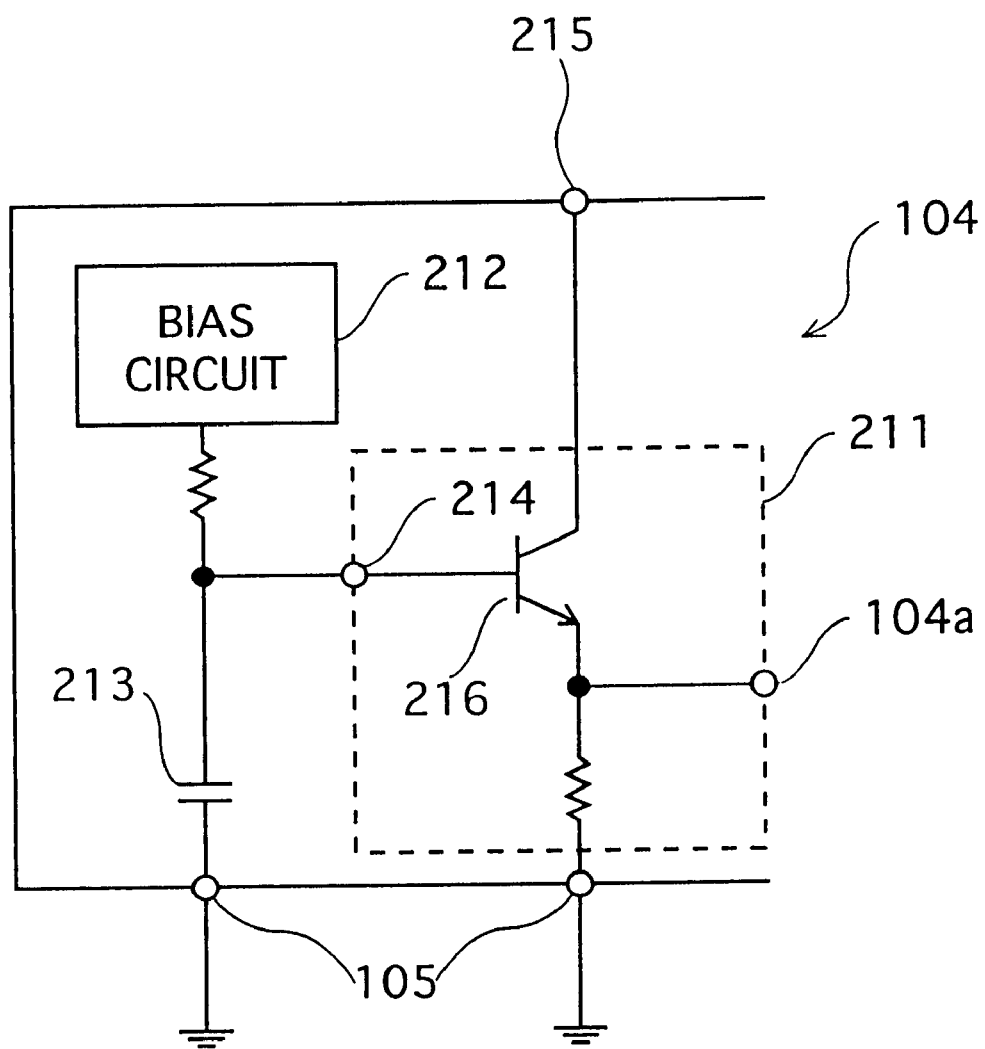
FIG. 5 shows a specific circuit construction of a low impedance voltage output circuit shown in FIGS. 3A and 3B.

FIG. 5 shows an example specific circuit construction of the low impedance voltage output circuit 104. This low impedance voltage output circuit 104 is realized by an emitter follower circuit 211 having a bipolar transistor 216 whose collector is connected to a power supply terminal 215 (direct-current voltage source of about +3V). With this emitter follower circuit 211, a potential that is about 0.7V lower than a potential of a reference potential input terminal 214 is output at low impedance, from the output node 104a connected to the emitter of the bipolar transistor 216.

A direct-current bias generated by a bias circuit 212 which is provided inside the integrated circuit device is given to the reference potential input terminal 214. The output of the bias circuit 212 is also grounded outside the integrated circuit device through an alternating-current coupling capacitance 213 and a terminal 105 connected to a ground terminal 106a, to pass high-frequency noise to a ground outside the integrated circuit device. As a result, the reference potential input terminal 214 is kept at a fixed potential that does not include any noise component even in the high-frequency range. When combined with the isolation region 102, this construction delivers prominent effects of suppressing leakage of noise components.

Figure 6:
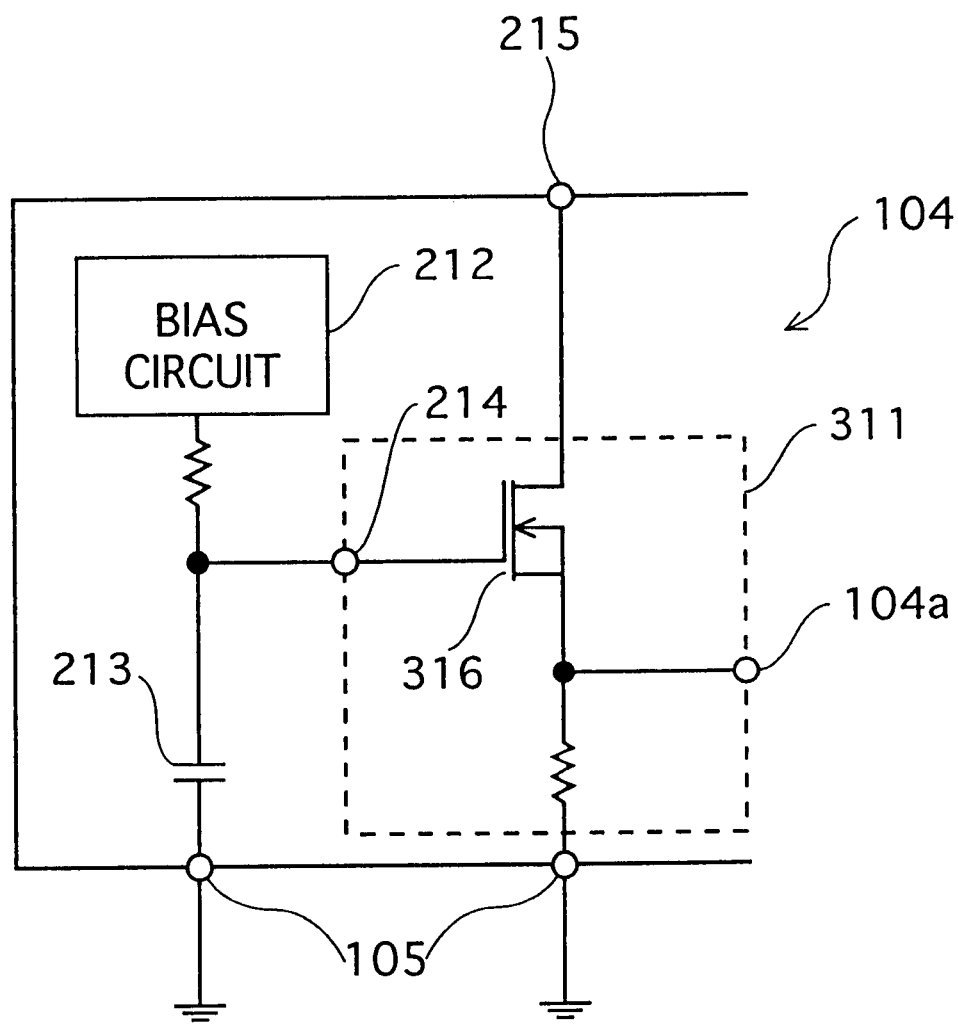
FIG. 6 shows another specific circuit construction of the low impedance voltage output circuit.

FIG. 6 shows another example specific circuit construction of the low impedance voltage output circuit 104. This low impedance voltage output circuit 104 is realized by a source follower circuit 311 having a field-effect transistor (FET) 316 whose drain is connected to the power supply terminal 215 (direct-current voltage source of about +3V). With this source follower circuit 311, a fixed potential that is determined by a potential of the reference potential input terminal 214 and a threshold voltage of the FET 316 is output at low impedance, from the output node 104a connected to the source of the FET 316.

A direct-current bias generated by the bias circuit 212 which is provided inside the integrated circuit device is given to the reference potential input terminal 214. The output of the bias circuit 212 is also grounded outside the integrated circuit device through the alternating-current coupling capacitance 213 and the terminal 105 as in FIG. 5, to pass high-frequency noise to a ground outside the integrated circuit device.

As a result, the reference potential input terminal 214 is kept at a fixed potential that does not include any noise component even in the high-frequency range. When combined with the isolation region 102, this construction delivers prominent effects of suppressing leakage of noise components.

It should be noted here that the low impedance voltage output circuit may be realized using a method other than the above circuit constructions, and the same noise leakage suppression effects can still be achieved when combined with the isolation region 102.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. An integrated circuit device comprising:
    a first circuit which is formed on a semiconductor substrate;
    a second circuit which is formed on the semiconductor substrate at a location different from the first circuit;
    an isolation region which has a higher conductivity than the semiconductor substrate, and is formed in the semiconductor substrate between the first circuit and the second circuit; and
    a low impedance voltage output circuit which provides a fixed voltage at a low impedance, to the isolation region.

2. The integrated circuit device of claim 1,
    wherein at least one of the first circuit and the second circuit is surrounded by the isolation region.

3. The integrated circuit device of claim 1,
    wherein the second circuit processes a signal whose level is lower than a signal processed by the first circuit.

4. The integrated circuit device of claim 3,
    wherein the second circuit includes a reception circuit for receiving a radio signal.

5. The integrated circuit device of claim 1,
    wherein the isolation region is one of an $N^+$ region and a $P^+$ region formed by ion implantation into the semiconductor substrate.

6. The integrated circuit device of claim 1,
    wherein the isolation region is formed from a conductive material, and is separated from the semiconductor substrate by an insulator.

7. The integrated circuit device of claim 6,
    wherein the conductive material is selected from the group consisting of $N^+$ polysilicon, $P^+$ polysilicon, and a metal.

8. The integrated circuit device of claim 1,
    wherein the isolation region has a trench structure.

9. The integrated circuit device of claim 1,
    wherein the low impedance voltage output circuit is supplied with a reference potential, and provides the fixed voltage corresponding to the reference potential to the isolation region at the low impedance, from an output node.

10. The integrated circuit device of claim 9,
    wherein the low impedance voltage output circuit includes:
        an emitter follower circuit which includes a bipolar transistor having a base supplied with the reference potential, and
        the output node is connected to an emitter of the bipolar transistor.

11. The integrated circuit device of claim 9,
    wherein the low impedance voltage output circuit includes:
        a source follower circuit which includes a field-effect transistor having a gate supplied with the reference potential, and
        the output node is connected to a source of the field-effect transistor.

12. The integrated circuit device of claim 9,
    wherein an input terminal of the low impedance voltage output circuit to which the reference potential is supplied is grounded through a capacitor.

13. The integrated circuit device of claim 1,
    wherein a plurality of low impedance voltage output circuits are electrically connected to the isolation region.

* * * * *